United States Patent [19]

Palmer

[11] 4,307,934
[45] Dec. 29, 1981

[54] PACKAGED FIBER OPTIC MODULES

[75] Inventor: John P. Palmer, Pomona, Calif.

[73] Assignee: General Dynamics, Pomona Division, Pomona, Calif.

[21] Appl. No.: 903,460

[22] Filed: May 8, 1978

[51] Int. Cl.³ .............................................. G02B 7/26
[52] U.S. Cl. ................................. 350/96.20; 250/227; 350/96.18; 357/74
[58] Field of Search ............... 250/227, 239, 552; 350/96.15, 96.17, 96.18, 96.20, 96.24, 96.25; 357/19, 74, 80

[56] References Cited

U.S. PATENT DOCUMENTS

| | | | |
|---|---|---|---|
| 3,414,733 | 12/1968 | Wunderman | 250/227 |
| 3,582,637 | 6/1971 | Cecil | 350/96.26 X |
| 3,700,900 | 10/1972 | Herleikson | 250/227 X |
| 3,705,992 | 12/1972 | Ippen et al. | 350/96.18 X |
| 3,710,091 | 1/1973 | Holcomb | 350/96.18 X |
| 3,790,791 | 2/1974 | Anderson | 250/227 |
| 3,792,284 | 2/1974 | Kaelin | 250/227 X |
| 3,803,409 | 4/1974 | Prochazka | 250/227 |
| 3,804,081 | 4/1974 | Kinoshita et al. | 350/96.25 X |
| 3,809,908 | 5/1974 | Clanton | 250/227 X |
| 3,816,847 | 6/1974 | Nagao | 357/74 X |
| 3,840,741 | 10/1974 | Melchior | 250/227 X |
| 3,842,257 | 10/1974 | Köhler | 250/239 X |
| 3,859,536 | 1/1975 | Thiel | 250/552 |
| 3,878,397 | 4/1975 | Robb et al. | 250/227 X |
| 3,892,962 | 7/1975 | Whited | 250/227 |
| 3,932,761 | 1/1976 | Ramsey et al. | 250/552 |
| 3,946,416 | 3/1976 | Hacskaylo | 357/74 X |
| 3,970,394 | 7/1976 | Stanton | 250/227 X |
| 4,003,074 | 1/1977 | Yonezu et al. | 357/74 |
| 4,060,309 | 11/1977 | Le Noane et al. | 350/96.18 |
| 4,118,105 | 10/1978 | Voigt | 350/96.20 |
| 4,144,541 | 3/1979 | Schaefer et al. | 357/74 X |
| 4,186,995 | 2/1980 | Schumacher | 350/96.20 |
| 4,204,743 | 5/1980 | Etaix | 350/96.20 |

FOREIGN PATENT DOCUMENTS 2727177 12/1977 Fed. Rep. of Germany ... 350/96.18

OTHER PUBLICATIONS

Funkschau, "Darmstadt-the Mecca of Television", vol. 48, No. 24, Nov. 1976, pp. 1073-1076.

Primary Examiner—John D. Lee
Attorney, Agent, or Firm—Henry M. Bissell; Edward B. Johnson

[57] ABSTRACT

A module for a fiber optic data transmission system which will accommodate either a suitable light source or a photoelectric detector. The module incorporates an integrated electronic assembly, such as a hybrid microelectronic assembly. The assembly has provision for a photoelectric transducer which preferably has a cylindrical mount disposed in a cylindrical recess of the electronic assembly. The entire assembly may be surrounded by a cylindrical can having a transparent window. The transducer is provided with a collimating lens which permits it to receive or emit a collimated light beam. Between the fiber optic bundle and the transducer, there is preferably disposed a focusing lens. The focusing lens receives or emits the collimated light beam and focuses it on the fiber optic bundle. A housing surrounds the entire module. Means, such as a retainer ring, are provided for holding the electronic assembly within the housing. Similar means are provided for maintaining the focusing lens within the housing. The distance between the focusing lens and the optical bundle is established by means of a ferrule which in turn is urged toward the housing by a nut and threaded sleeve portion.

21 Claims, 3 Drawing Figures

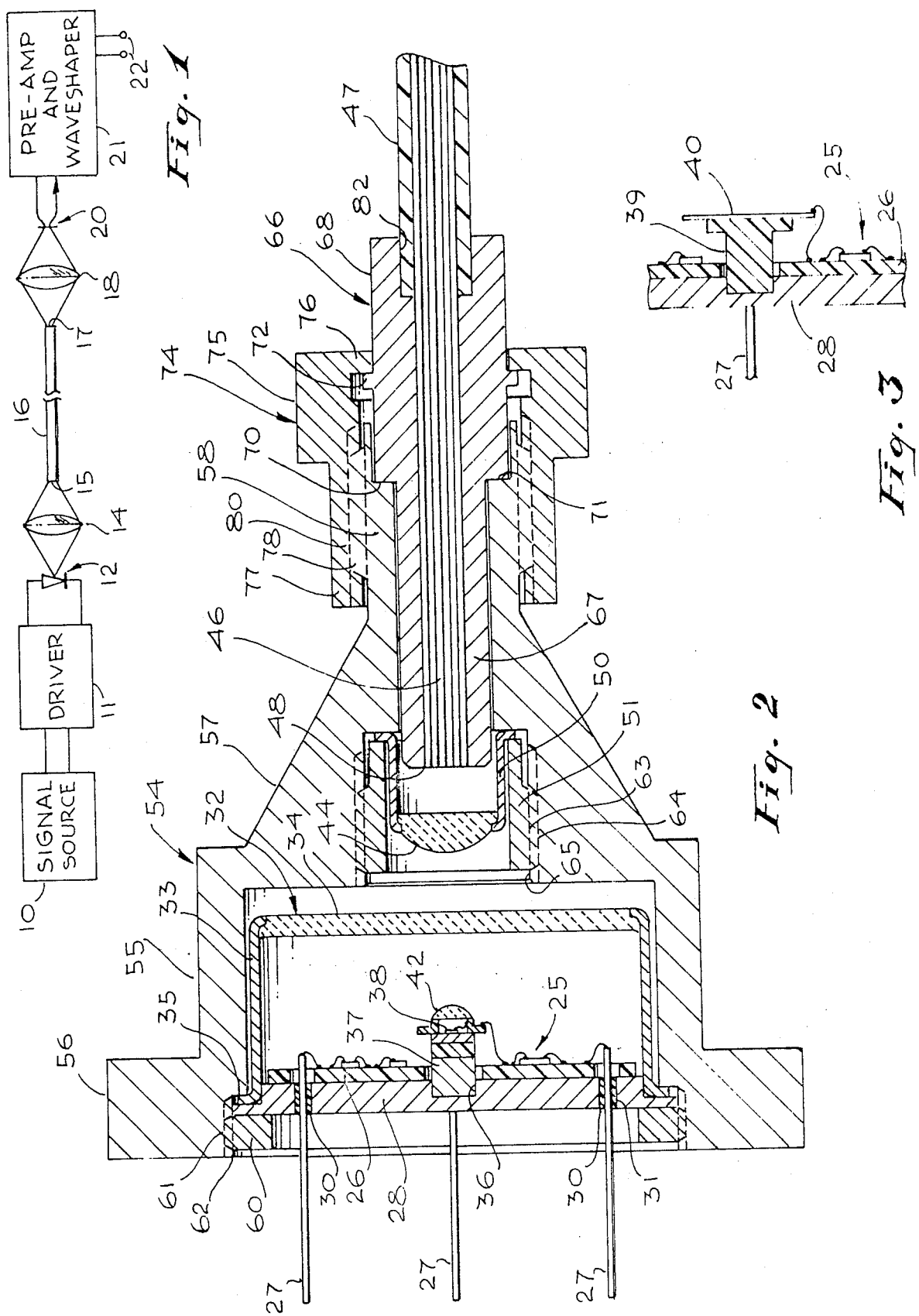

PACKAGED FIBER OPTIC MODULES

BACKGROUND OF THE INVENTION

1. Field of the Invention

This invention relates generally to a package for a fiber optic module and particularly relates to such a module suitable for either a light source or for a photodetector.

2. Description of the Prior Art

The present invention is directed toward an optical data transmission system. Such a system includes a bundle of optic fibers. Each fiber is suitably clad and may consist, for example, of glass or a transparent plastic. Such a system may include a signal source and a driver for driving the light source to be modulated. The light emitted by the light source must then be directed or focused on the optic fiber bundle. At the other end, the light emitted by the fiber bundle is then focused upon a suitable photodetector which is followed by a preamplifier and wave shaper.

Various attempts have been made in the past to provide such an electro-optical transmission link. This generally includes an assembly whereby the fiber optic bundle may be mounted together with the light source at one end and a photodetector at the other.

Among these prior art patents, reference is made to a patent to Cecil U.S. Pat. No. 3,582,637 and a patent to Kaelin, U.S. Pat. No. 3,792,284. Further mention is made of a patent to Clanton, U.S. Pat. No. 3,809,908 and to Robb, U.S. Pat. No. 3,878,397. Finally the patent to Anderson U.S. Pat. No. 3,790,791 shows in some detail the manner for mounting a fiber optic bundle with ferrules for cooperation with a suitable light source or photodetector.

None of these patents, however, show an efficient means for focusing the light, either from the light source to the fiber bundle, or from the fiber bundle to the photodetector. None of these patents show a means for including hybrid microelectronic circuitry into the module in an efficient manner. Neither does the prior art show a practical way for precisely locating the photoelectric transducer with respect to the fiber optic bundle.

SUMMARY OF THE INVENTION

In accordance with the present invention, there is provided a fiber optic module suitable for either an optic transmitter or an optic receiver. The module includes an electronic assembly such as a hybrid microelectronic assembly which may be received by a cylindrical can having a transparent window. The transducer preferably is disposed on a cylindrical mount received by a cylindrical recess in the electronic assembly. The transducer itself is associated with a collimating lens whereby an at least partially collimated light beam is either emitted or received.

The fiber optic bundle itself is properly spaced from a focusing lens disposed between the transducer and the fiber optic bundle. The entire assembly is mounted in a suitable housing which may consist of metal to minimize electrical interference. The focusing lens is properly mounted in the housing and concentric therewith. Finally, means are provided for locating the fiber bundle so that its end is in the focal plane of the focusing lens.

The novel features which are considered characteristic of this invention are set forth with particularity in the appended claims. The invention itself, however, both as to its organization and method of operation, as well as additional objects and advantages thereof, will best be understood from the following description when read in connection with the accompanying drawings.

BRIEF DESCRIPTION OF THE DRAWINGS

FIG. 1 is a somewhat schematic diagram of an optical data transmission system of the type to which the present invention is directed;

FIG. 2 is a partially sectioned, assembled view of the transmitting or receiving end of the fiber optic module of the present invention; and FIG. 3 is a partial, sectional view of a modified transducer shown mounted in its base, the remainder of the module being identical to that of FIG. 2.

DESCRIPTION OF THE PREFERRED EMBODIMENT

Referring now to the drawings, and particularly to FIG. 1, there is illustrated, somewhat schematically, an optical data transmission system to which the fiber optic module of the present invention pertains. The system of FIG. 1 includes a signal source 10 coupled to a driver 11 which in turn serves to modulate a light source 12. The light source 12 may, for example, consist of a light emitting diode or, alternatively, a pn junction laser. In any case, the driver 11 modulates the light source 12 so that the resulting light beam is in accordance with a signal of the signal source 10.

The modulated light beam is then focused by a lens system such as the lens 14 on one end 15 of a fiber optic bundle 16. The optical fibers of the bundle 16 may consist, for example, of glass or a suitable plastic, being clad or coated with a material having an index of refraction lower than that of the fiber itself. This will cause light to be reflected by the coating substantially without loss.

The other end 17 of the fiber optic bundle will then emit the modulated light as generated by the light source 12. This light beam may then be focused by a lens 18 upon a photosensitive device 20. The photosensitive device may consist, for example, of a pn or pin diode. The electrical signal generated by the photosensitive detector 20 is then impressed upon a preamplifier 21 which may include a wave shaper, if desired. The electrical output signal may then be obtained from output terminal 22.

FIG. 2, to which reference is now made, illustrates a module embodying the present invention for a fiber optic communication system of the type illustrated in FIG. 1. The module or package for the fiber optic communication system of FIG. 2 may be used either with a light source that may be modulated, or with a suitable photodetector.

The module of FIG. 2 includes an electronic assembly generally shown at 25. This may, for example, be a hybrid microelectronic assembly which may consist of a plurality of integrated chips. They may represent, for example, a preamplifier or a postamplifier and additional electronic equipment. The electronic assembly includes an insulating plate 26, such as a suitable ceramic plate on which integrated chips and the like are mounted. The assembly 25 is provided with a plurality of pins 27 of which there may be three or more. The pins or leads may not all be necessary, but at least one is used for the input or output signal, one for the electrical power, and one for the ground connection.

The mounting plate 26, which carries the integrated circuits 25, may in turn be disposed on a metallic plate or base 28 through which the pins or leads 27 extend. Each of the leads 27 is insulated by an insulating sleeve 30 extending through an aperture 31 in base 28.

The electronic assembly may further include a window can 32. The window can 32 includes a generally cylindrical housing 33 which, in turn mounts a transparent window 34, which may consist of optically flat glass or transparent plastic. The housing 33 for the window can 32 has an outwardly extending L-shaped base 35 which may be connected to the base 28 in any suitable manner, for example, by welding to provide a unitary, airtight construction.

The insulating plate 26, on which the electronic chips are mounted, and its base 28 are both provided with a central, cylindrical recess 36 in which is mounted a cylindrical support 37 for an electro-optic transducer 38. The transducer 38 may be supplied with power through the input leads 27 and may be properly connected to the integrated electronic circuit for modulating or demodulating it. In case the transducer 38 consists of a light source, it may either be a light emitting diode or a pn junction laser. However, in case the transducer 38 consists of a photosensitive device, it may be a photo-diode as previously explained.

In any case, the electro-optic transducer 38 is preferably integrally connected with a collimating lens 42. The collimating lens 42 will partially collimate a light beam originating from a light source 38 or will focus a collimated light beam onto a photo-detector 38 as the case may be. A so-called lens-can 50 including a second lens 44 may, for example, consist of an assembly known as TO-46, which is available from Spectronics, Inc. However, it will be understood that other assemblies or constructions may be used instead. Similarly, the hybrid microelectronic assembly 25, including the window can 32 with window 34 may consist of a package known in the trade as a TO-8 assembly or window can, which is available from Airpax, Inc. The electro-optical transducer 38 and collimating lens 42 preferably are encapsulated into a so-called pill package, as manufactured by Motorola, Hewlett-Packard, or Texas Instruments.

The second or focusing lens 44 is provided between the flat optical window 34 and an optical fiber bundle 46 for focusing or collimating light between the window 34 and the fiber bundle end 48, depending on the direction of light travel. The fiber bundle 46 is conventionally enclosed in a flexible sheath or jacket 47 which is removed from the front end of the fiber bundle 46 as shown. Thus, the focusing lens 44 is disposed between the collimating lens 42 and the end 48 of the fiber bundle. The focusing lens 44 is held in a lens can 50 which is of generally cylindrical construction. It may, in turn, be secured by a lens retainer ring 51.

The electronic assembly 25 with the window 34 and its can 32, the focusing lens 44 and the fiber bundle 46 are all disposed in a housing 54 which is preferably of metal to minimize electrical interference with the electronic package 25. The housing 54 includes a relatively large diameter cylindrical portion 55 for enclosing the window can 32 and the electronic assembly 25. It may be provided with a base 56 of circular outline which may be provided with suitable openings for securing the entire assembly to a bulkhead or printed circuit board. The housing 54 then continues with a conical portion 57 surrounding the focusing lens 44 in its lens can 50. The rear or right-hand portion of the housing 54 consists of a sleeve 58 for surrounding the fiber bundle 46.

The electronic assembly 25 may be held within the housing 54 by a retainer ring 60 having external threads 61 meshing with internal threads 62 in a cylindrical opening of the housing base 56. However, it will be understood that the retaining ring 60 for the assembly 25 as well as the retaining ring 51 for the focusing lens assembly 44, 50, may be replaced by a potting compound or the like. The retaining ring 51 is also provided with external threads 63, meshing with internal threads 64 on a cylindrical recess 65 within the conical housing portion 57.

The fiber bundle 46 is held in a ferrule 66 of generally cylindrical shape. It has a cylindrical front portion 67 of relatively small diameter followed by a cylindrical portion 68 of larger diameter and forming a shoulder 70 therebetween. The ferrule shoulder 70 abuts against a corresponding shoulder 71 in the housing portion 58. The ferrule 66 is also provided with a cylindrical projection 72 intermediate its ends which is engageable with a nut and sleeve 74. The nut 75 has an internally projecting, cylindrical portion 76, capable of engaging the outwardly extending cylindrical projection 72 of the ferrule 66 when the nut 75 is moved toward the left of FIG. 2. This may be accomplished by an internally threaded sleeve portion 77 integral with the nut 75. The internal threads 78 of the sleeve portion 77 engage the external threads 80 of the housing portion 58.

It will now be seen that when the nut and sleeve 74 are threaded to move toward the left of FIG. 2, the projection 76 of the nut and sleeve 74 will engage the projection 72 on the ferrule 66 and move the ferrule 66 toward the left until its shoulder 70 engages the shoulder 71 on the housing. This in turn will locate the end 48 of the fiber optic bundle 46 in the focusing plane of the focusing lens 44.

The ferrule 66 is provided with an enlarged cylindrical recess 82 for accommodating the jacket 47 of the fiber bundle 46. The entire unit, including the fiber bundle 46 and its ferrule 66 and including the sleeve 74 are commercially available from Amphenol. This unit is known as an optical SMA connector.

In view of the fact that the lens 42 is a collimating lens, the distance between the electro-optic transducer 38 and the focusing lens 44 is not critical. However, the distance between the focusing lens 44 and the end 48 of the fiber bundle 46 is critical. Typically, the focal length of the focusing lens 44 is 0.140 inch. As explained hereinbefore, this distance is maintained by the ferrule 66 and its shoulder 70, abutting the corresponding shoulder 71 on the housing 54.

Instead of providing a relatively small electro-optic transducer 38 and a collimating lens 42, it is also feasible to utilize a relatively large transducer. Such an alternative configuration has been illustrated in FIG. 3 to which reference is now made. The large area photo diode 40 is mounted on a pedestal 39 which in turn is disposed in a suitable aperture in the base 28. The pedestal 39 may be made from a dielectric material, such as a ceramic or polymer resin so as to electrically insulate the photo diode 40 from the header 28.

It will be obvious that such a large area photo diode 40 intercepts a higher proportion of the light emitted from the end surface 48 of the fiber bundle 46, and focused by the focusing lens 44 than does the relatively small transducer 38 and collimating lens 42 of the construction of FIG. 2.

The large area photo diode 40 is protected from adverse environmental influences because the window can 32 and the header 28 are sealed hermetically at 35.

The large area diode 40, of course, has an increased capacitance. The undesirable effects of this capacitance may readily be compensated by the preamplifier circuit 25. This compensation may take the form of a voltage-shunt feedback applied to a transimpedance amplifier. Such an amplifier is well known in the present state of the art.

The module of the present invention has the advantage that it is suitable for either a modulated light source or a photoelectric detector; that is, for either the transmitter or the receiver of the data transmission system. Further, it has the capability to include integrated electronics within the package. This assures high-speed operation associated with hybrid microelectronic assemblies. The electro-optic transducer 38 and its collimating lens 42 are readily located with extreme precision. Furthermore, the transducer 38 may be hermetically sealed in its package including the collimating lens 42. Because the optical efficiency is high, due to the provision of the collimating lens 42 and the focusing lens 44, it is possible to utilize smaller size diodes than were possible with previously known arrangements. This in turn, results in a lower diode capacitance, and, of course, higher speed of response.

Although there have been described above specific arrangements illustrating a preferred method of packaging fiber optic modules in accordance with the invention for the purpose of illustrating the manner in which the invention may be used to advantage, it will be appreciated that the invention is not limited thereto. Accordingly, any and all modifications, variations or equivalent arrangements which occur to those skilled in the art should be considered to be within the scope of the invention as defined in the appended claims.

What is claimed is:

1. A module for a fiber optic communication system comprising:
    (a) an electronic assembly including at least an amplifier, said electronic assembly being mounted on a substantially flat plate and hermetically sealed within a window can housing having a transparent, optically flat window mounted to form a face opposite the plate and spaced therefrom;
    (b) means for applying a signal to or receiving a signal from said electronic assembly;
    (c) an electro-optic transducer disposed on said assembly;
    (d) a fiber optic bundle having a planar end disposed in the path of a light beam transmitted through said window between said transducer and said end, the bundle, in combination with a ferrule and sleeve mounted thereon, forming a standard optical connector;
    (e) a focusing lens disposed between said transducer and said planar end of said fiber optic bundle, said lens having a planar surface and being disposed directly adjacent said bundle, and being adapted to focus light transmitted from the transducer to said bundle independent of said assembly;
    (f) a housing surrounding said electronic assembly, said focusing lens and said fiber optic bundle;
    (g) means including a standard lens can for mounting said focusing lens with its planar surface facing the planar end of the bundle within said housing; and
    (h) means for maintaining the distance between said focusing lens and said end of said fiber optic bundle so that said end of said fiber optic bundle is in the focal plane of said focusing lens.

2. A module as defined in claim 1 wherein said transducer is of relatively large area to intercept a large portion of the light emitted by the focusing lens.

3. A module as defined in claim 1 wherein the ferrule is disposed adjacent the end of said fiber optic bundle, said ferrule having a shoulder between its ends, said shoulder abutting a corresponding shoulder formed in said housing, and further comprising means capable of engaging said ferrule and having a threaded sleeve portion engaging external threads on said housing for urging said ferrule against the shoulder on said housing, thereby to determine the distance between said focusing lens and the end of said fiber bundle.

4. A module as defined in claim 1 wherein said electro-optic transducer is disposed on a cylindrical mounting engaging a central cylindrical ring in said electronic assembly, thereby to locate precisely said electro-optic transducer.

5. A module as defined in claim 1 wherein said electro-optic transducer comprises a light source.

6. A module as defined in claim 5 wherein said light source consists of a light-emitting diode.

7. A module as defined in claim 5 wherein said light source consists of a pn junction laser.

8. A module as defined in claim 1 wherein said electro-optic transducer comprises a photosensitive device.

9. A module as defined in claim 8 wherein said photosensitive device consists of a photodiode.

10. A module as defined in claim 1 wherein said electronic assembly is surrounded by a cylindrical housing and has a light transparent window disposed between said electro-optic transducer and said focusing lens.

11. A module as defined in claim 1 further comprising a retainer ring for retaining the electronic assembly in said housing and means for threadably engaging said retainer ring with said housing.

12. A module as defined in claim 1 wherein said focusing lens is retained in said housing by a retainer ring, and including means for threadably engaging said retainer ring with said housing.

13. The module of claim 1 wherein the lens can includes a cylindrical fixture having a flange bearing against a mating interior surface of the opaque housing, and further comprising a retainer ring bearing against the flange to hold it in position within the opaque housing.

14. The module of claim 13 wherein the standard optical connector includes a ferrule affixed about the end portion of the fiber optic bundle and having a shoulder for abutting a corresponding shoulder formed within the opaque housing, and a threaded sleeve surrounding the ferrule and engaging a projecting portion thereof to direct the ferrule against the shoulder of the opaque housing.

15. A module for a fiber optic communication system comprising:
    (a) an electronic assembly including at least an amplifier, said electronic assembly being mounted on a substantially flat plate and hermetically sealed within a window can housing having a transparent, optically flat window mounted to form a face opposite the plate and spaced therefrom;
    (b) means for applying a light signal to or receiving a light signal from said electronic assembly;

(c) an electro-optic transducer disposed on said assembly within said window can housing;
(d) a fiber optic bundle having an end disposed in the path of a light beam transmitted through said window;
(e) a focusing lens disposed between said transducer and said one end of said fiber optic bundle, said lens being disposed directly adjacent said bundle, and having means for focusing light transmitted through said lens to said bundle independent of said assembly;
(f) a collimating lens integrally packaged with the transducer in a standard pill package mounting said collimating lens adjacent said transducer, said collimating lens collimating light from said transducer to form a light beam;
(g) a housing surrounding said electronic assembly, said lenses and said fiber optic bundle;
(h) means including a lens can and retainer ring for mounting said focusing lens in said housing in a first preselected position; and
(i) means for maintaining the distance between said focusing lens and said end of said fiber optic bundle so that said end of said fiber optic bundle is in the focal plane of said focusing lens.

16. A connector for coupling an optical fiber member, a focusing lens and a semiconductor device in preselected fixed spatial relationship comprising in combination:

a bundle of optical fibers capable of transmitting light signals in either direction and terminating in a planar end generally orthogonal to the axis of the bundle, the bundle being combined with a ferrule and sleeve in a standard optical connector;

an electro-optic transducer spaced from the end of the fiber bundle along a path of light signals transmitted by the fiber bundle and hermetically sealed within a window can housing having a transparent, optically flat window mounted to form a face opposite the plate and spaced therefrom;

a focusing lens and a collimating lens positioned along said light path passing through the window between the transducer and the planar end of the fiber bundle, said collimating lens being integrally packaged with the transducer in a pill package mounting said lens adjacent the electro-optic transducer to collimate a light signal produced by the transducer into a collimated beam directed toward the focusing lens, the focusing lens being mounted in a standard lens can positioned adjacent the end of the fiber bundle such as to focus said collimated beam on the planar end of the bundle; and an opaque housing including means for mounting therein the window can housing, the lens can and the standard optical connector in fixed spatial relationship.

17. The device of claim 16 wherein both of the lenses are formed with one planar surface and an opposed convex surface, and are mounted with the convex surfaces facing each other.

18. The device of claim 17 wherein the lens can includes means for mounting the focusing lens with its planar surface facing the end of the fiber bundle and fixed in position relative to the opaque housing.

19. The device of claim 18 wherein the opaque housing includes threaded means for mating with the standard optical connector to mount the fiber bundle within the opaque housing in a fixed position relative to the opaque housing, thereby determining the distance between the planar end of the fiber bundle and the planar surface of the focusing lens.

20. The device of claim 19 wherein the ferrule encases the fiber bundle and has a shoulder formed thereon, and the sleeve is threaded onto the opaque housing for urging the shoulder of the ferrule against a mating surface within the opaque housing.

21. The device of claim 18 wherein the lens can includes a cylindrical fixture having a flange bearing against a mating surface within the opaque housing, and further comprising a threaded collar forcing the flange against a second shoulder within the opaque housing.

* * * * *